US011689116B2

(12) United States Patent
Schmenger et al.

(10) Patent No.: US 11,689,116 B2
(45) Date of Patent: Jun. 27, 2023

(54) MULTILEVEL POWER CONVERTER WITH OPTIMIZED TOPOLOGY

(71) Applicant: Siemens Aktiengesellschaft, Munich (DE)

(72) Inventors: Jens Schmenger, Forchheim (DE); Lutz Namyslo, Hausen (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 124 days.

(21) Appl. No.: 17/402,207

(22) Filed: Aug. 13, 2021

(65) Prior Publication Data
US 2022/0052617 A1 Feb. 17, 2022

(30) Foreign Application Priority Data
Aug. 14, 2020 (EP) .................... 20191124

(51) Int. Cl.
H05K 7/20 (2006.01)
H05K 7/14 (2006.01)
H02M 7/00 (2006.01)
H02M 7/5387 (2007.01)
H02M 5/293 (2006.01)

(52) U.S. Cl.
CPC ......... *H02M 7/003* (2013.01); *H02M 7/5387* (2013.01); *H05K 7/1432* (2013.01); *H05K 7/209* (2013.01); *H02M 5/293* (2013.01)

(58) Field of Classification Search
CPC .... H02M 7/003; H02M 7/483; H02M 7/4837; H02M 7/537; H02M 7/5387; H02M 5/293; H05K 7/209; H05K 7/1432; H05K 7/14; H05K 7/20; H05K 1/16
See application file for complete search history.

(56) References Cited

U.S. PATENT DOCUMENTS

2010/0328833 A1* 12/2010 Frisch ................... H01L 25/162
361/111
2013/0242631 A1* 9/2013 Inayoshi ................ H05K 7/209
363/132

(Continued)

FOREIGN PATENT DOCUMENTS

DE 102015224431 A1 6/2016
EP 3157154 A1 4/2017
WO WO 2020052829 A1 3/2020

*Primary Examiner* — Thienvu V Tran
*Assistant Examiner* — Shahzeb K Ahmad
(74) *Attorney, Agent, or Firm* — Henry M. Feiereisen LLC

(57) ABSTRACT

A substrate and a first circuit board each have an upper side and a lower side. The substrate lower side is connected to a cooling body. On the upper side of the substrate, first electronic switching elements connect an alternating current potential at a phase terminal to a high direct current potential at a first potential terminal and to a low direct current potential at a second potential terminal. Second electronic switching elements connect the alternating current potential to a middle direct current potential at a third potential terminal. The substrate is spaced from the first circuit board under the first circuit board lower side. The upper side of the substrate faces toward the first circuit board. The second switching elements are at least on the upper side of the first circuit board, possibly additionally also on the lower side of the first circuit board.

16 Claims, 7 Drawing Sheets

(56) References Cited

U.S. PATENT DOCUMENTS

| | | | |
|---|---|---|---|
| 2016/0192495 A1* | 6/2016 | Nakamura | H01L 23/5227 |
| | | | 361/783 |
| 2018/0206359 A1* | 7/2018 | McPherson | H02M 7/003 |
| 2019/0267912 A1* | 8/2019 | Ishino | H01L 24/42 |
| 2020/0204082 A1* | 6/2020 | Yamaguchi | H02M 7/487 |

\* cited by examiner

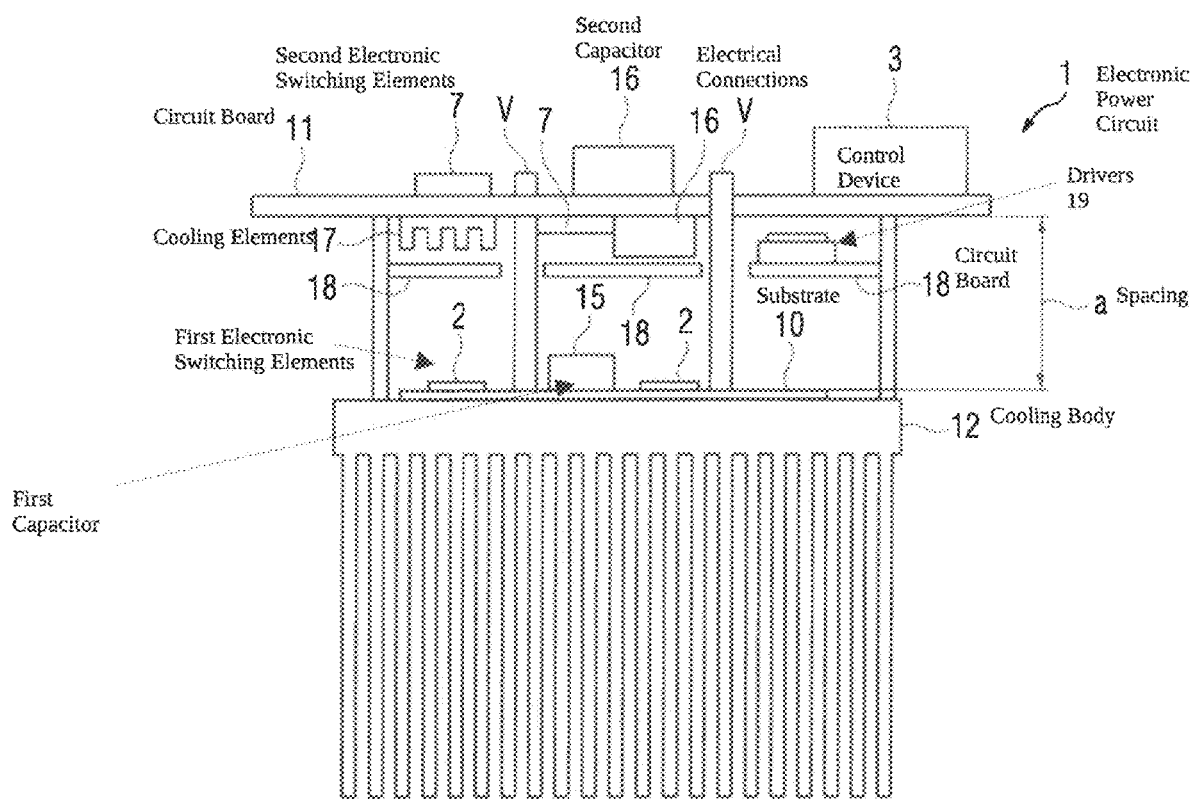

MULTILEVEL POWER CONVERTER WITH OPTIMIZED TOPOLOGY

CROSS-REFERENCES TO RELATED APPLICATIONS

This application claims the priority of European Patent Application, Serial No. EP 20191124.5, filed Aug. 14, 2020, pursuant to 35 U.S.C. 119(a) (d), the disclosure of which is incorporated herein by reference in its entirety as if fully set forth herein.

BACKGROUND OF THE INVENTION

The present invention relates to an electronic power circuit with first electronic switching elements arranged on an upper side of a substrate and second electronic switching elements arranged on an upper side of a circuit board.

The following discussion of related art is provided to assist the reader in understanding the advantages of the invention, and is not to be construed as an admission that this related art is prior art to this invention.

Such electronic power circuits are commonly known. In particular, so-called 3L power converters (3L=3 level=3 different voltage levels on the direct current side) are configured in this way. The middle direct current potential lies, as the name suggests, between the high and the low direct current potential. Typically, it lies in the middle or at least approximately in the middle between the high and the low direct current potential.

In recent times, electronic semiconductor switches which are designated so-called WBG components have increasingly become known. The abbreviation "WBG" stands in this context for "wide band gap". Typical representatives of such semiconductor switches are switching elements on the basis of silicon carbide (SiC) and gallium nitride (GaN), Newer switching elements on the basis of silicon (Si) are worthy of mention in this regard. The switching elements can be, for example, thyristors, lGBTs and FETs (including MOSFETs and JFETs).

Switching elements on the basis of gallium nitride have many technical advantages. In particular, they have an extremely short switching time, i.e. they can be transferred in a very short time from the blocked (=non-conductive) to the connected-through (=conductive) state or conversely from the connected-through to the blocked state. The switching times can be in the region of a few ns and even less than 1 ns. Switching elements on the basis of gallium nitride, however, have some disadvantages in practical use. For example, switching elements of this type withstand a short circuit only for a significantly shorter duration than other switching elements. Furthermore, they are typically only available hi a housing, but not as housing-free switching elements (bare die). As a result, the losses occurring in the corresponding switching elements on the basis of gallium nitride can only be conducted away relatively poorly. Finally, design-limited maximum connected voltages for switching elements on the basis of gallium nitride are limited to a region of significantly below 1 kV. In practice, the limit is currently approximately 650 V.

As compared with switching elements on the basis of gallium nitride, switching elements on the basis of silicon carbide can endure a short-circuit for a significantly longer duration. They are available both in a housing and also as housing-free (bare die) switching elements. Designs are available on the market in which the design-limited maximum switched voltage lies in a region of several kV, for example, up to 3 kV.

In practice, therefore in the case of power converters, switched mode power supplies and the like in which high voltages and large power levels are switched, despite the advantages of switching elements on the basis of gallium nitride, switching elements on the basis of silicon carbide are used, since they can be arranged on a substrate without great difficulty and can be cooled there effectively. For lower voltages and/or lower power levels, in the prior art, switching elements on the basis of gallium nitride are also used. However, these switching elements are in any case arranged on a common conventionally constructed circuit board.

It would therefore be desirable and advantageous to provide an improved electronic power circuit to obviate prior art shortcomings in a simple, economical and technically advantageous manner.

SUMMARY OF THE INVENTION

According to one aspect of the invention, an electronic power circuit includes a first circuit board, a substrate electrically connected to the first circuit board and arranged at a spacing from the first circuit board under a lower side of the first circuit board, so that an upper side of the substrate faces toward the first circuit board, a cooling body connected to a lower side of the substrate, a phase terminal, a first potential terminal, a second potential terminal, a third potential terminal, first electronic switching elements arranged on the upper side of the substrate, the first electronic switching elements connecting through an alternating current potential present at the phase terminal to a high direct current potential present at the first potential terminal and to a low direct current potential present at the second potential terminal, and second electronic switching elements arranged on an upper side of the first circuit board; the second electronic switching elements connecting through the alternating current potential present at the phase terminal to a middle direct current potential present at the third potential terminal.

By arranging the first electronic switching elements on the substrate, high voltages and large power levels can be switched, while still enabling a good removal of the power loss arising in the first electronic switching elements via the cooling body. Through the arrangement of the second electronic switching elements on the first circuit board, simple implementations of the circuit can be brought about. In particular, the second electronic switching elements do not have to be arranged on the substrate so that the power loss to be conducted away via the cooling body is smaller as would be the case when arranging—as is suggested heretofore—the second electronic switching elements in addition to the first electronic switching elements also on the substrate. Furthermore, more space—specifically the area of the substrate plus the area of the circuit board—becomes available for placement of the first and second electronic switching elements.

According to another advantageous feature of the invention, additional second electronic switching elements may be arranged also on the lower side of the first circuit board.

According to another advantageous feature of the invention, during operation of the electronic power circuit, the first electronic switching elements may have a higher power loss than the second electronic switching elements. As a result, the arrangement of the second electronic switching elements causes no great difficulties for conducting away of power losses arising during operation of the second electronic switching elements.

The alternating current potential may vary as a function of time between an upper and a lower value. Typically, the upper and lower values lie in the region of the high and the low direct current potential. It is possible that the smaller power loss of the second electronic switching elements results entirely automatically due to the lower potential difference switched on average. Other reasons are however also possible. In particular, it is possible that the cause of the mutually different power losses can lie in the first electronic switching elements having a higher conducting state voltage and/or greater switching times and/or a greater conductive resistance than the second electronic switching elements.

The conducting state voltage relates to the voltage which, in the connected-through state of the respective electronic switching element, exists across the respective electronic switching element. In conjunction with the switched current, it results in the power loss arising in the respective electronic switching element (power=voltage x current). The switching time relates to the time which is needed for switching over the respective electronic switching element from the blocked state into the connected-through state or the reverse. During switching-over, the respective electronic switching element is in a transient state in which firstly a relatively high voltage exists across the respective electronic switching element (significantly above the conducting state voltage) and secondly an appreciable current is already flowing. The transient state may only be maintained briefly. The longer the transient state lasts, and thus the longer the switching time is, the greater is the switching energy that arises in the respective electronic switching element during a single switch-over process and must be conducted away as heat.

The cause of the mutually different conducting state voltages and/or the mutually different switching times can be, in particular, that the first electronic switching elements and the second electronic switching elements can be realized in different semiconductor technologies. In particular, the first electronic switching elements can be configured as switching elements on the basis of silicon carbide and the second electronic switching elements can be configured as switching elements on the basis of gallium nitride.

According to another advantageous feature of the invention, the first electronic switching elements may be configured as housing-free switching elements. Such switching elements are generally known as bare die elements. Due to the use of housing-free switching elements, the power loss arising in the first electronic switching elements can be transferred particularly rapidly to the substrate and from there again to the cooling body.

According to another advantageous feature of the invention, the second electronic switching elements can be configured as switching elements arranged in a housing and the second electronic switching elements can be fastened with the housing on the first circuit board. In this way, e.g. when using switching elements on the basis of gallium nitride, commercially available second electronic switching elements can be used. The second electronic switching elements can be soldered onto the first circuit board, or fastened by clamping onto the first circuit board.

According to another advantageous feature of the invention, each electronic switching element can have a design-limited maximum switched voltage. The maximum switched voltage relates to the voltage which can still reliably block the respective electronic switching element and keep it blocked. In the case of voltages above the maximum switched voltage, however, the danger exists that a switch-over from the connected-through state to the blocked state is no longer possible and/or that an electrical breakdown with a directly subsequent failure of the electronic switching element takes place, so that the electronic switching element becomes permanently conductive. Advantageously, the design-limited maximum switched voltages of the first electronic switching elements can be higher than the design-limited maximum switched voltages of the second electronic switching elements. Typically, the quotient of these voltages lies between 1.2 and 2.0. The design-limited maximum switched voltages of the first electronic switching elements are therefore typically higher by 20% to 100% than the design-limited maximum switched voltages of the second electronic switching elements. Currently preferred is when the design-limited maximum switched voltages of the first electronic switching elements are higher than the voltage that is possible for the switching elements on the basis of gallium nitride, whereas the design-limited maximum switched voltages of the second electronic switching elements lie below this voltage.

By switching-through the first electronic switching elements, first current paths can be electrically conductively connected to one another. Blocking of the first electronic switching elements electrically separates the first current paths from one another. The first current paths are thus switched by the first electronic switching elements. According to another advantageous feature of the invention, the first electronic switching elements can be bridged by first auxiliary circuits containing first capacitors. This results in an improved current flow. Advantageously, the first auxiliary circuits can be arranged on the substrate. In this way, the first auxiliary circuits can act particularly effectively.

Likewise, by switching through and blocking the second electronic switching elements, second current paths can be electrically conductively combined with one another and electrically separated from one another. According to another advantageous feature of the invention, the second electronic switching elements can be bridged by second auxiliary circuits containing second capacitors. This also results in an improved current flow. The second auxiliary circuits may advantageously be arranged on the first circuit board. In this way, the second auxiliary circuits can act particularly effectively. The first and second capacitors of the auxiliary circuits are known as pulse capacitors. They are also typically constructed as ceramic capacitors.

According to another advantageous feature of the invention, cooling elements may be arranged on the lower side of the first circuit board to conduct away power losses arising in the second electronic switching elements. It is therefore not critical if relatively large power losses arise in the second electronic switching elements. The cooling elements may extend only so far away from the first circuit board that they are still spaced from the substrate. They can also be regarded as cooling bodies. The expression "cooling elements" (as distinct from "cooling bodies") serves substantially for linguistic distinction from the cooling body of the substrate.

According to another advantageous feature of the invention, a second circuit board which is electrically connected to the first circuit board and/or the substrate can be arranged between the first circuit board and the substrate. In this way, a greater flexibility is provided hi the arrangement of different electronic components (switching elements and others) and an improved utilization of the volume needed by the electronic power circuit.

According to another advantageous feature of the invention, the lower side of the substrate can be connected to the cooling body directly, via a heat-conducting paste or via a metal layer. In this way, the losses arising in the first electronic switching elements can be conducted away particularly well to the cooling body.

According to another advantageous feature of the invention, an electronic power circuit according to the invention can be used in a power converter. A power converter can be, for example, a rectifier, an inverter, a converter or a DC-DC converter. Alternatively, the electronic power circuit according to the invention can be used in a switched mode power supply.

BRIEF DESCRIPTION OF THE DRAWING

The above-described properties, features and advantages of this invention and the manner in which they are achieved are made more clearly and distinctly intelligible with the following description of the exemplary embodiments which are described in greater detail making reference to the drawings.

Other features and advantages of the present invention will be more readily apparent upon reading the following description of currently preferred exemplified embodiments of the invention with reference to the accompanying drawings, in which:

FIG. 9 shows a modification of the mechanical design of FIG. 3.

DETAILED DESCRIPTION OF PREFERRED EMBODIMENTS

Figure 1:
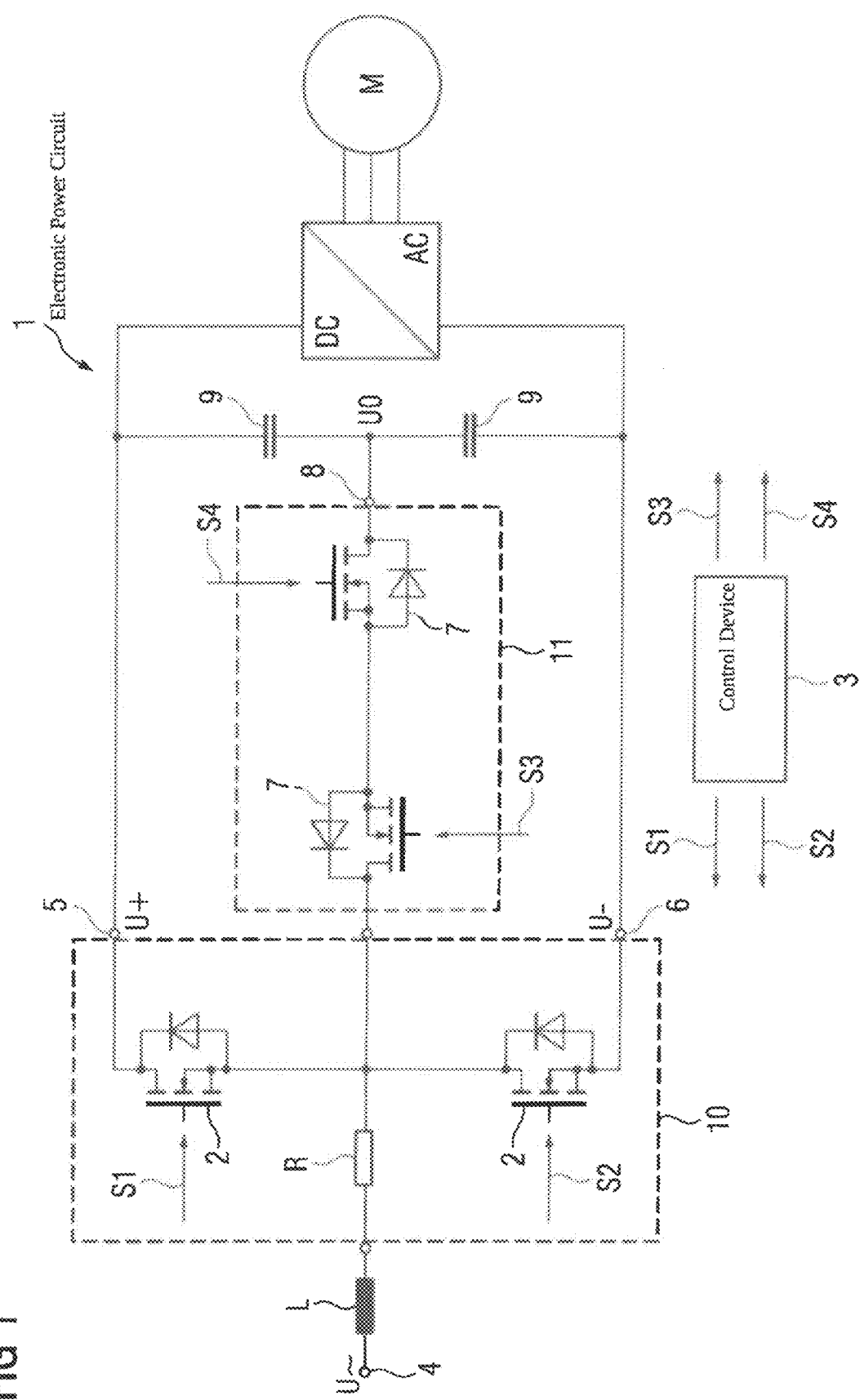
FIG. 1 shows an electrical block circuit diagram of an electronic power circuit.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown an electronic power circuit, generally designated by reference numeral 1, and a downstream bad in the form of an inverter and a motor. The downstream bad is not part of the subject matter of the present invention.

The electronic power circuit 1 has first electronic switching elements 2. The first electronic switching elements 2 can be configured, for example, as IGBTs (=insulated gate bipolar transistors) or, according to the representation in FIG. 1, as FETs (=field effect transistors). A special case of FETs are MOSFETs. The first electronic switching elements 2 are typically diodes connected in parallel according to the representation in FIG. 1. The diodes can be independent components or intrinsic components of the first electronic switching elements 2.

The first electronic switching elements 2 can alternatively be connected-through or blocked. The respective switching state is determined by control signals S1, S2 which are fed to the first electronic switching elements 2. The control signals S1, S2 are generated by a control device 3.

An alternating current potential U~ can be connected through to a high direct current potential U+ by one of the two first electronic switching elements 2. By the other of the two first electronic switching elements 2, the alternating current potential U~ can be connected through to a low direct current potential U−, The alternating current potential U~ is applied to one phase terminal 4 of the power circuit 1, the high direct current potential U+ is applied to a first potential terminal 5 of the power circuit 1, the low direct current potential U− is applied to a second potential terminal 6 of the power circuit 1.

The electronic power circuit 1 also has second electronic switching elements 7. Two second switching elements 7 are typically provided, connected in series one behind the other, according to the representation in FIG. 1. The second electronic switching elements 7 can be configured similarly to the first electronic switching elements 2, for example, as thyristors, as IGBTs or as FETs. Typically diodes are also connected in parallel to the first electronic switching elements 7, according to the representation in FIG. 1. Similarly to the diodes connected in parallel to the first electronic switching elements 2, the diodes can be independent components or intrinsic constituents of the second electronic switching elements 7.

The two electronic switching elements 7 can alternatively be connected-through or blocked. The respective switching state is determined by control signals S3, S4 which are fed to the two second electronic switching elements 7. The control signals S3, S4 are also generated by a control device 3. In many cases, a similar activation of the two second electronic switching elements 7 can take place such that the second electronic switching elements 7 are thus either both connected through or both blocked.

By the second electronic switching elements 7, the alternating current potential U~ can be connected through to a middle direct current potential U0. The middle direct current potential U0 is applied to a third potential terminal 8 of the electronic power circuit 1. It lies between the high and the low direct current potential U+, U−, usually (at least approximately) in the middle between the two other direct current potentials U+, U−.

Typically, according to the representation in FIG. 1, capacitors 9 via which the third potential terminal 8 is capacitively coupled to the first and second potential terminal 4, 5 are present. It is thereby achieved, in particular, that the middle direct current potential U0 lies between the high and the low direct current potential U+, U−.

Figure 2:
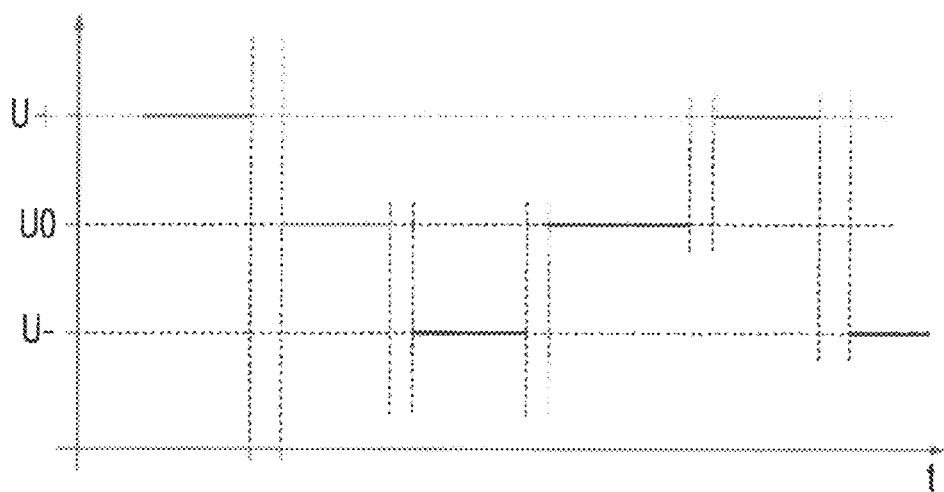
FIG. 2 shows a time diagram.

The first and second electronic switching elements 2, 7 are typically controlled such that the alternating current potential U~ is connected through at every time point to a maximum of one of the direct current potentials U+, U−, U0. However, brief exceptions can occur during the occurrence of the transient states of the first and second electronic switching elements 2, 7. The connecting-through of the alternating current potential U~ respectively to just one of the direct current potentials U+, U−, U0 is evident from FIG. 2. FIG. 2 shows, as a function of time t, to which of the three direct current potentials U+, U−, U0 the alternating current potential U~ is connected through in each case. As shown, the switching timeframes in which the alternating current potential U~ is connected through respectively to one of the three direct current potentials U+, U−, U0 are separated from one another by short pauses.

A resistor R can be arranged between the phase terminal 4 and the first and second electronic switching elements 2, 7, according to the representation in FIG. 1. The resistor R is a shunt resistor. It serves for the detection and regulation, based thereupon, of the actually switched current. According to the representation in FIG. 1, an inductance L can be arranged between the phase terminal 4 and the first and second electronic switching elements 2, 7. The inductance L serves for current smoothing. The resistor R, where present, is a constituent of the electronic power circuit 1. The inductance L can be a constituent of the electronic power circuit 1. Alternatively, it can be an independent component which is not a constituent of the electronic power circuit 1.

The electronic power circuit 1 described above in conjunction with FIGS. 1 and 2 can be used, in particular, for a power converter or for a switched mode power supply.

Figure 3:
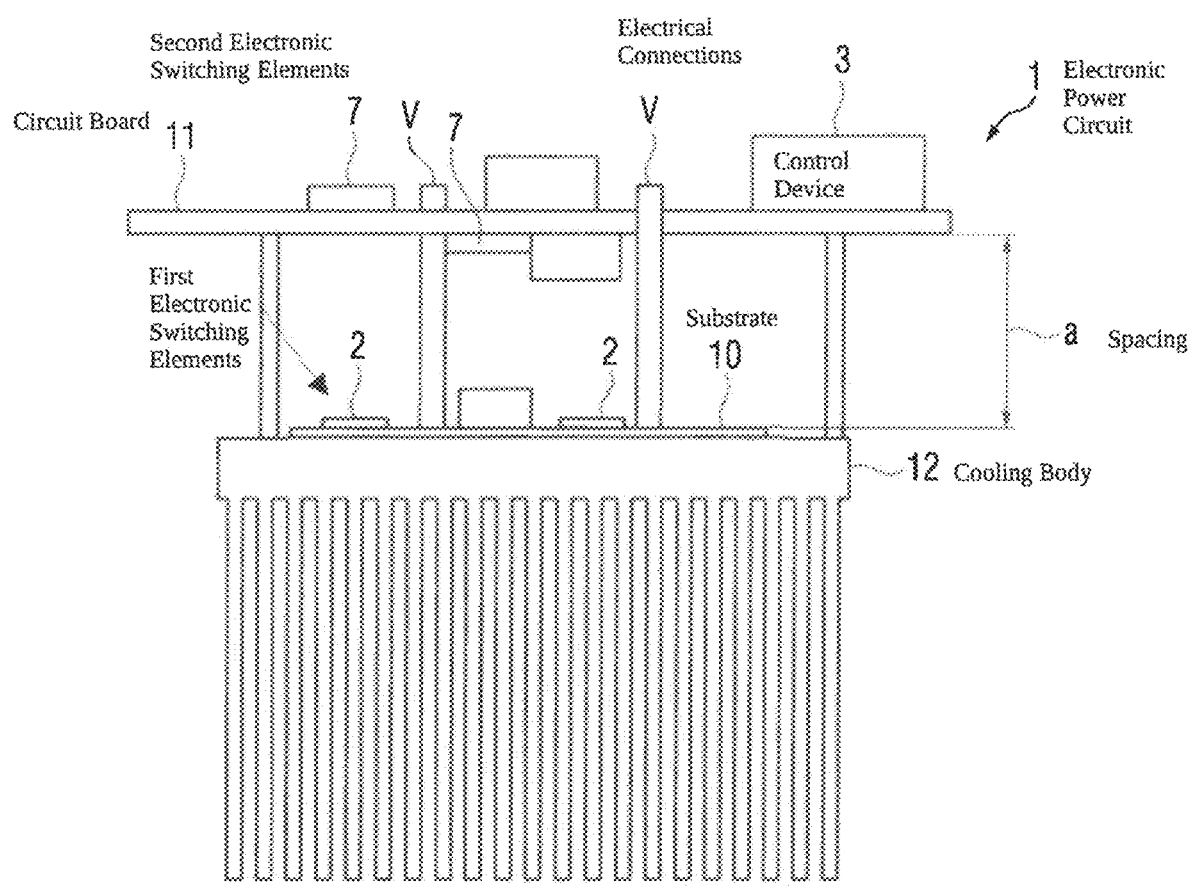
FIG. 3 shows a mechanical design of the electronic power circuit of FIG. 1.

In order to implement the electronic power circuit 1 described above in conjunction with FIG. 1, according to the representation in FIG. 3, the electronic power circuit 1 has a substrate 10 and a first circuit board 11.

The substrate 10 has an upper side and a lower side. A metal layer is applied both to the upper side and to the lower side, respectively. The metal layers can be structured. The substrate 10 itself is made of a dielectric material which—at least typically—has a thickness of between 25 µm and 400 µm. The dielectric material may advantageously be made of a ceramic material, for example, aluminum nitride or aluminum oxide. Alternatively, it may also be made of a plastics material, for example, a polyamide or a polyimide.

Arranged on the upper side of the substrate 10 are the first electronic switching elements 2. The first electronic switching elements 2 can be arranged, in particular, integrally bonded on the substrate 10. Examples of suitable integrally bonded connections are a solder connection and a sinter connection. The connection of the first electronic switching elements 2 to the substrate 10 is often designated DCB (direct copper bonding) or DBC (direct bonding copper). The resistor R (not shown in FIG. 3), if present, is advantageously also arranged on the upper side of the substrate 10. However, the resistor R can also be arranged at another site, for example, on the first circuit board 11.

The lower side of the substrate 10 is connected to a cooling body 12. The cooling body 12 is made of a readily heat-conducting metal, typically aluminum or an aluminum alloy, sometimes also copper or a copper alloy. Typically, the cooling body 12 has cooling ribs in accordance with the representation in FIG. 3. Power losses arising in the first electronic switching elements 2 or otherwise can be transferred from the substrate 10 to the cooling body 12 and dissipated from the cooling body 12 to the surroundings.

Figure 4:
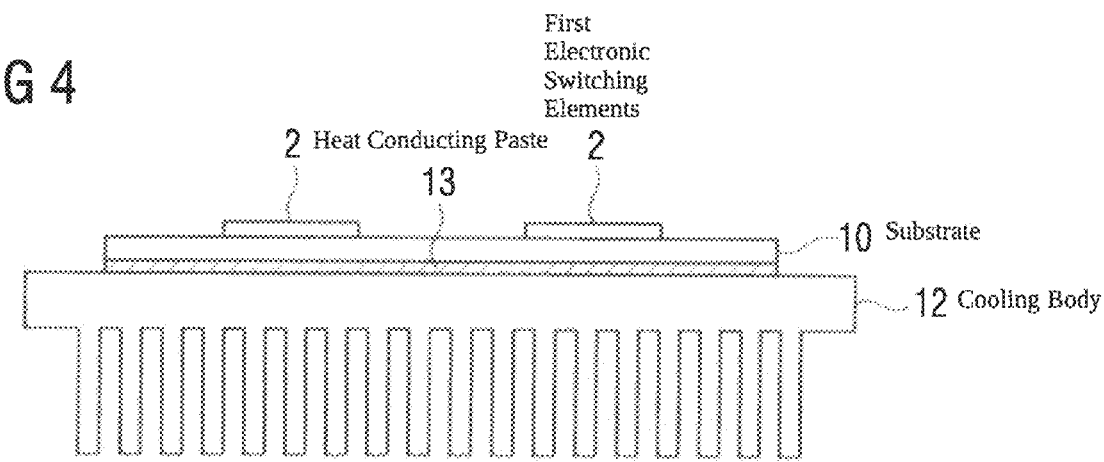
FIG. 4 shows a substrate and a cooling body.
Figure 5:
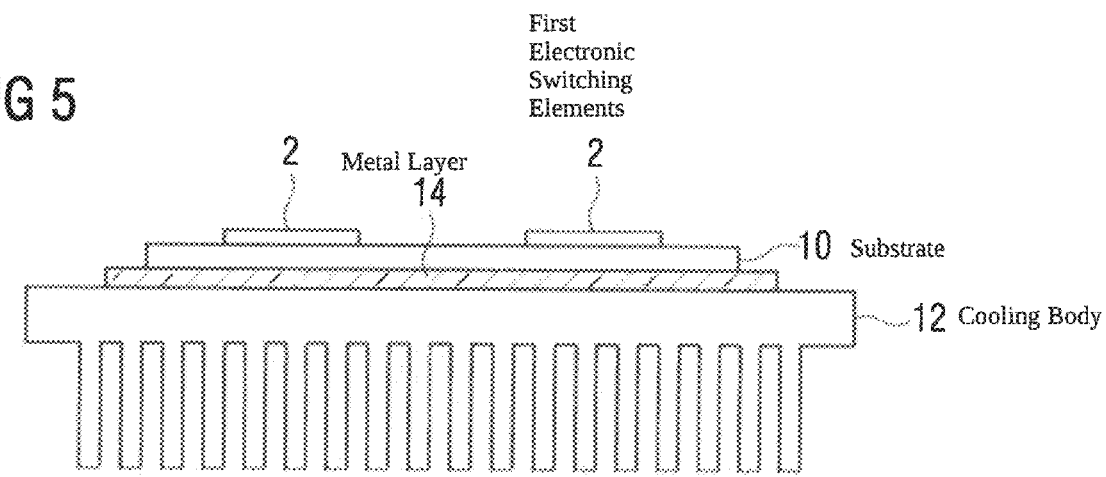
FIG. 5 shows a substrate and a cooling body.

For good thermal coupling of the substrate 10 to the cooling body 12, it is possible that the lower side of the substrate 10 is connected, in accordance with the representation in FIG. 3, directly to the cooling body 12. Alternatively, in accordance with the representation in FIG. 4, it is possible that the lower side of the substrate 10 is connected via a heat-conducting paste 13 to the cooling body 12. According to a further alternative, the lower side of the substrate 10 is connected, as shown in FIG. 5, via a metal layer 14 to the cooling body 12.

The first circuit board 11 is typically configured as a normal circuit board, i.e. as a circuit board which is made of a glass fiber mat impregnated with a resin or a glass fiber woven fabric impregnated with resin. A typical example is a so-called FR4 circuit board. Alternatively, the circuit board may also be made of a polyimide (with or without glass fibers) or PTFE (with or without glass fibers). In individual cases, the circuit board 11 can also be made of a ceramic material, in particular, aluminum oxide.

In accordance with the representation in FIG. 3, the first circuit board 11 also has an upper side and a lower side. The second electronic switching elements 7 are arranged at least on the upper side of the first circuit board 11. Where relevant, the second electronic switching elements 7 can be arranged, in accordance with the representation in FIG. 3, partially on the upper side and partially on the lower side of the first circuit board 11.

The substrate 10 is arranged at a spacing a from the first circuit board 11 under the lower side of the first circuit board 11. The spacing a is typically in the region of a few cm. The upper side of the substrate 10 faces toward the first circuit board 11.

The substrate 10 is electrically connected to the first circuit board 11, Corresponding electrical connections V serve firstly to guide the voltages and currents switched by the first electronic switching elements 2. The control device 3 is typically arranged on the first circuit board 11. In this case, the electrical connections V further serve for transferring the control signals S1 and S2 to the first electronic switching elements 2.

On the basis of the arrangement of the first electronic switching elements 2 on the substrate 10, it is possible to operate the first electronic switching elements 2 with a relatively high power loss. However, due to the arrangement of the second electronic switching elements 7 on the first circuit board 11, the second electronic switching elements 7 can only be operated with a lower power loss. This often results automatically from the operating mode as such. This is for the reason that if A denotes the amplitude of the alternating current potential U~, in the most unfavorable case, it can be required that the two first electronic switching elements 2 switch a voltage which has the value U+ plus A. For the first electronic switching elements 2, this case arises if the alternating current potential U~ currently has the value −A and the alternating current potential U~ is connected through to the high direct current potential U+. For the other first electronic switching elements 2, this case arises if the alternating current potential U~ currently has the value+A and the alternating current potential U~ is connected through to the low direct current potential U. The middle direct current potential U0, however, typically lies in the region of the zero crossing of the alternating current potential U~. When connecting through to the middle direct current potential U0, even in the most unfavorable case, therefore, only one voltage, having the value A, must be switched.

Figure 6:
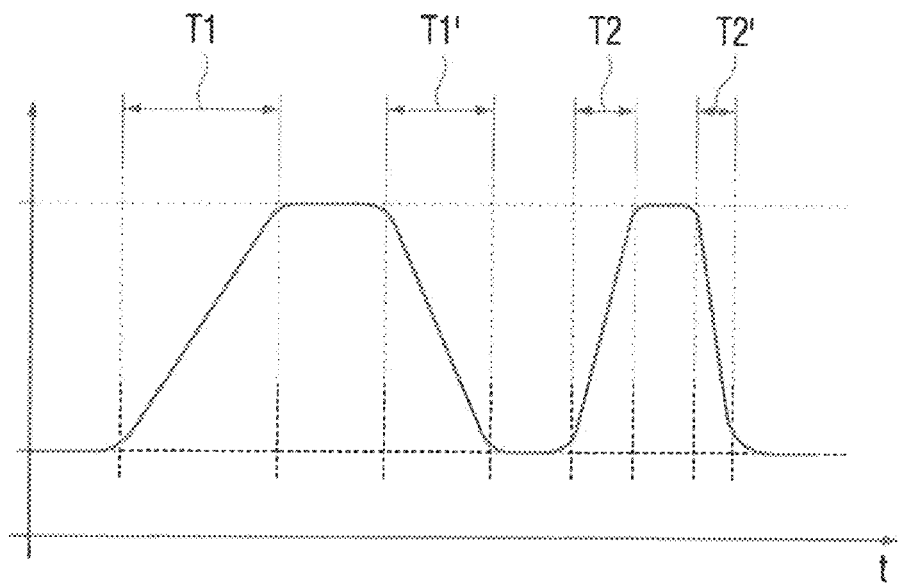
FIG. 6 shows a time diagram.
Figure 7:
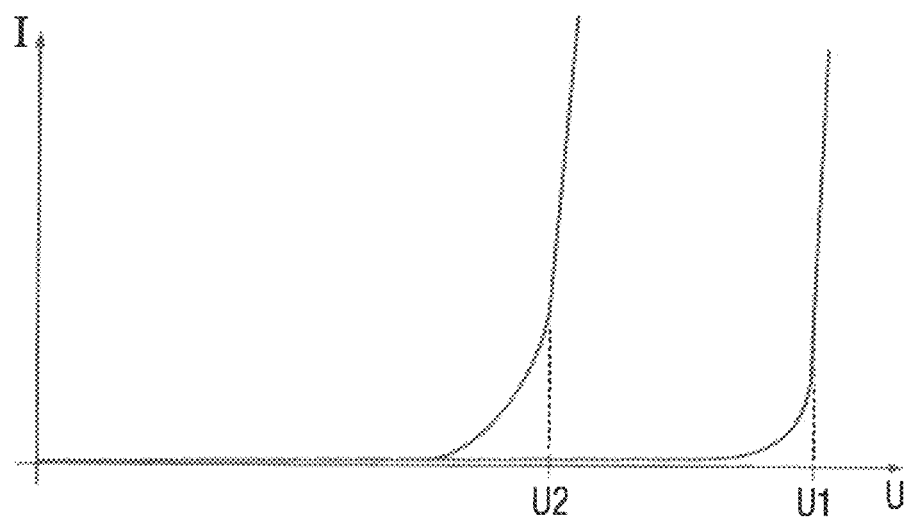
FIG. 7 shows current vs voltage characteristic curves.

However, further reasons therefor are possible, so that the first electronic switching elements 2 have a higher power loss during operation of the electronic power circuit 1 than the second electronic switching elements 7, For example, in accordance with the representation in FIG. 6, it is possible that the first electronic switching elements 2 require a switching time T1 for switching over from the blocked to the connected-through state and a switching time T1' for switching over from the connected-through to the blocked state, whereas the second electronic switching elements 7 require a switching time T2 for switching over from the blocked to the connected-through state and a switching time T2' for switching over from the connected-through to the blocked state, wherein the switching times T2, T2' are shorter than the switching times T1, T1'. A ratio of the switching times T1, T2 or T1', T2' can be, for example, between 3.0 and 20.0. A further possible cause for a difference in the power loss can be that, in accordance with the representation in FIG. 7, as a current I is conducted via the first electronic switching elements 2, a conducting state voltage U1 exists across the first electronic switching elements 2, and a conducting state voltage U2 exists across the second electronic switching elements 7, wherein the conducting state voltage U2 of the second electronic switching elements 7 is lower than the conducting state voltage U1 of the first electronic switching elements. In a similar manner, it is also possible that the first electronic switching elements 2 have a greater conductive resistance in the connected-through state than the second electronic switching elements 7. This latter case can occur, in particular, with unipolar switching elements, thus in particular, FETs.

In order to achieve a particularly good conducting away of the power loss arising in the first electronic switching elements 2 into the substrate 10 and from there again to the cooling body 12, the first electronic switching elements 2 are advantageously configured as housing-free (bare die) switching elements. This is indicated, in particular, in FIGS. 3 to 5 in that the first electronic switching elements 2 are shown very flat. The second electronic switching elements 7, by contrast, are typically configured as switching elements arranged in a housing. In this case, the second electronic switching elements 7 are—naturally—fastened with the housing on the first circuit board 11, for example, soldered thereon. The embodiment as switching elements arranged in a housing is indicated in FIG. 3 in that the second electronic switching elements 7 are drawn significantly higher and a little broader than the first electronic switching elements 2.

As previously mentioned, the first electronic switching elements 2 must be capable of switching, and above all also blocking, a higher voltage than the second electronic switching elements 7. It is therefore possible that the design-limited maximum switched voltages of the first electronic switching elements 2 are higher than the design-limited maximum switched voltages of the second electronic switching elements. This is typically also advantageous because an electronic switching element with a lower design-limited maximum switched voltage is typically more economical than an otherwise identical electronic switching element with a higher design-limited maximum switched voltage.

Preferably, the maximum switched voltages of the second electronic switching elements 7 have a value of 650 V or less. The maximum switched voltages of the first electronic switching elements 2, by comparison, can also have a higher value, for example, a value of 1.0 kV or more. Other values are however naturally also possible. In particular, at a value of the maximum switched voltage of the second electronic switching element 7 of 650 V or less, the second electronic switching elements 7 can be configured on the basis of gallium nitride and thus the advantages of electronic switching elements on the basis of gallium nitride can be utilized.

Figure 8:
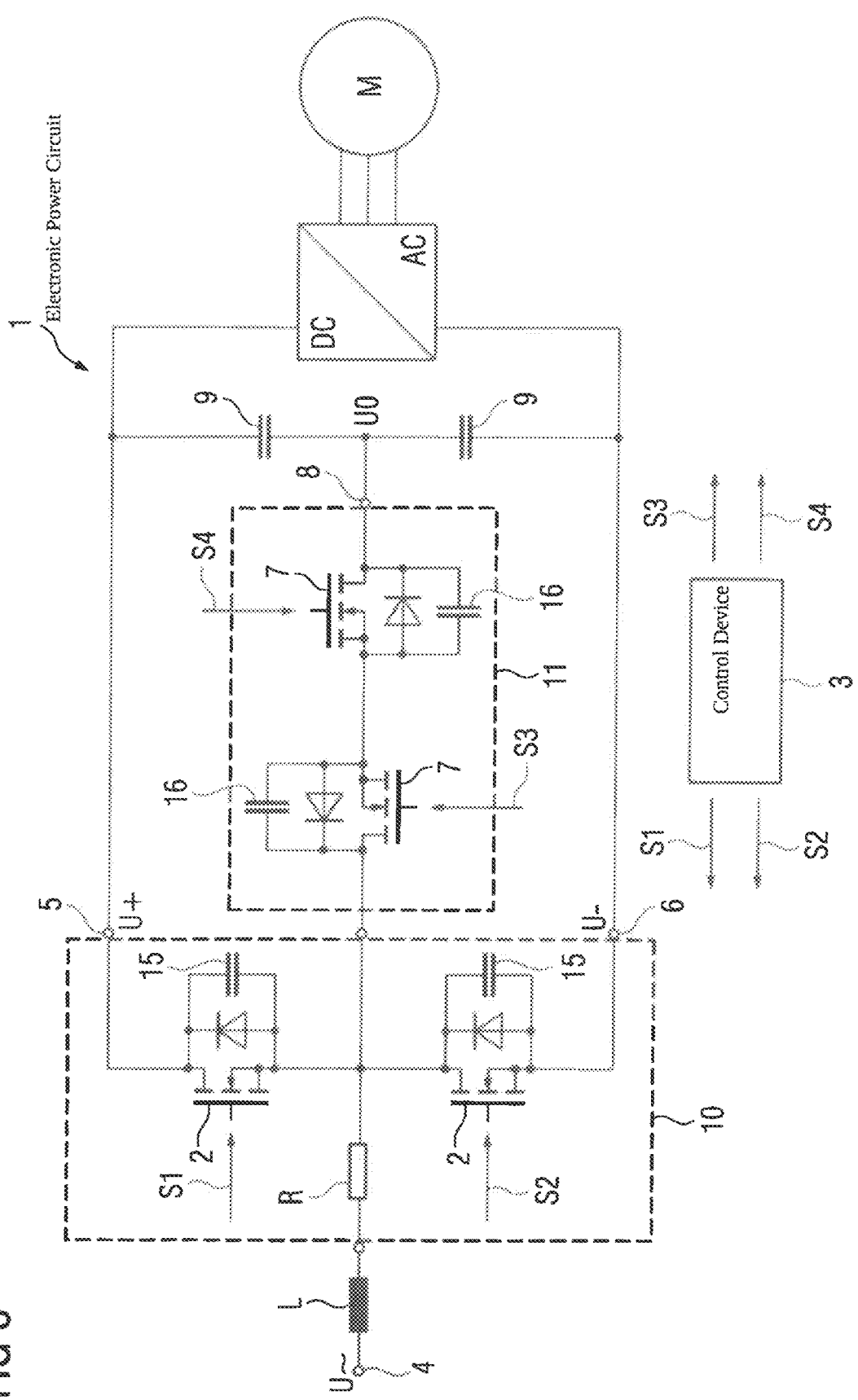
FIG. 8 shows a modification of the electrical block circuit diagram of FIG. 1.

FIGS. 8 and 9 show a modification of the electronic power circuit of FIGS. 1 and 3. According to FIGS. 8 and 9, first capacitors 15 are provided, by which the first electronic switching elements 2 are bridged. In a similar manner, second capacitors 16 are provided, by which the second electronic switching elements 7 are bridged. From FIGS. 8 and 9, it is further apparent that the first capacitors 15 are arranged on the substrate 10, whereas the second capacitors 16 are arranged on the first circuit board 11. Otherwise, the above statements regarding FIGS. 1 to 7 are also applicable.

The first and second capacitors 15, 16 are the simples embodiments of first and second auxiliary circuits which bridge the first and second electronic switching elements 2, 7. However, the first and second auxiliary circuits could also be configured as RC elements, that is, they could each have a resistor connected in series with the first and second capacitor 15, 16. With the first and second auxiliary circuits, this results in an improved current flow.

Furthermore, according to FIGS. 8 and 9, for each of the second electronic switching elements 7 a dedicated second capacitor 16 (or more generally, a dedicated second auxiliary circuit) is provided. However, it is alternatively possible to bridge the two second electronic switching elements 7 by a single second capacitor 16 (or more generally, a single second auxiliary circuit).

FIG. 9 additionally shows two further advantageous embodiments of the present invention. These two embodiments are described together below, but are realizable independently of one another.

Firstly, according to FIG. 9, cooling elements 17 are arranged on the lower side of the first circuit board 11. By the cooling elements 17, in particular, power losses which occur in the second electronic switching elements 7 can be conducted away.

Secondly, at least one second circuit board 18 is arranged between the first circuit board 11 and the substrate 10. With regard to the possible embodiments of the second circuit board 18 or the second circuit boards 18, the configurations of the first circuit board 11 can be used similarly. For example, drivers 19 can be arranged on the at least one second circuit board 18. The at least one second circuit board 18 is electrically connected to the first circuit board 11 and/or to the substrate 10.

The present invention has been described above in relation to a single phase terminal 4. However, it is equally possible that the electronic power circuit 1 has a plurality of phase connections 4. In this case, the first and second electronic switching elements 2, 7 are present separately for each phase terminal 4. The potential terminals 5, 6, 8 can be used jointly.

In summary, the present invention therefore relates to the following subject matter:

A substrate 10 and a first circuit board 11 each have an upper side and a lower side. The lower side of the substrate 10 is connected to a cooling body 12. Arranged on the upper side of the substrate 10 are first electronic switching elements 2, by of which an alternating current potential U~ present at a phase terminal 4 can be connected through to a high direct current potential U+ present at a first potential terminal 5 and can be connected through to a low direct current potential U− present at a second potential terminal 6. By second electronic switching elements 7, the alternating current potential U~ can be connected through to a middle direct current potential U0 present at a third potential terminal 8. The substrate 10 is arranged at a spacing a from the first circuit board 11 under the lower side of the first circuit board 11, so that the upper side of the substrate 10 faces toward the first circuit board 11. The substrate 10 is electrically connected to the first circuit board 11. The second switching elements 7 are arranged at least on the upper side of the first circuit board 11, possibly additionally on the lower side of the first circuit board 11.

The present invention has many advantages. In particular, a compact electronic power circuit is realizable in a flexible manner.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. An electronic power circuit, comprising:
 a first circuit board;
 a substrate electrically connected to the first circuit board and arranged at a spacing from the first circuit board under a lower side of the first circuit board, so that an upper side of the substrate faces toward the first circuit board;
 a cooling body connected to a lower side of the substrate;
 a phase terminal,
 a first potential terminal;
 a second potential terminal;
 a third potential terminal;
 first electronic switching elements arranged on the upper side of the substrate, said first electronic switching elements connecting through an alternating current potential present at the phase terminal to a high direct current potential present at the first potential terminal and to a low direct current potential present at the second potential terminal; and
 second electronic switching elements arranged on an upper side of the first circuit board; said second electronic switching elements connecting through the alternating current potential present at the phase terminal to a middle direct current potential present at the third potential terminal.

2. The electronic power circuit of claim 1, further comprising additional second electronic switching elements arranged on the lower side of the first circuit board.

3. The electronic power circuit of claim 1, wherein during operation of the electronic power circuit, the first electronic switching elements have a higher power loss than the second electronic switching elements.

4. The electronic power circuit of claim 3, wherein the first electronic switching elements have a higher conducing state voltage and/or greater switching times and/or a greater conducive resistance than the second electronic switching elements.

5. The electronic power circuit of claim 1, wherein the first electronic switching elements have a higher conducting state voltage and/or greater switching times and/or a greater conducive resistance than the second electronic switching elements.

6. The electronic power circuit of claim 1, wherein the first electronic switching elements and the second electric switching elements are realized in different semiconductor technologies.

7. The electronic power circuit of claim 6, wherein the first electronic switching elements are configured as silicon carbide switching elements and the second electronic switching elements are configured as gallium nitride switching elements.

8. The electronic power circuit of claim 1, wherein the first electronic switching elements are configured as housing-free switching elements.

9. The electronic power circuit of claim 1, further comprising a housing, said second electronic switching elements configured as switching elements and arranged in the housing, said second electronic switching elements being fastened with the housing on the first circuit board.

10. The electronic power circuit of claim 1, wherein design-limited maximum switched voltages of the first electronic switching elements are higher than design-limited maximum switched voltages of the second electronic switching elements.

11. The electronic power circuit of claim 1, wherein the first electronic switching elements are bridged by first auxiliary circuits containing first capacitors, said first auxiliary circuits arranged on the substrate.

12. The electronic power circuit of claim 1, wherein the second electronic switching elements are bridged by second auxiliary circuits containing second capacitors, said second auxiliary circuits arranged on the first circuit board.

13. The electronic power circuit of claim 1, further comprising cooling elements arranged on the lower side of the first circuit board to conduct away power losses arising in the second electronic switching elements.

14. The electronic power circuit of claim 1, further comprising a second circuit board arranged between the first circuit board and the substrate and electrically connected to the first circuit board and/or the substrate.

15. The electronic power circuit of claim 1, wherein the lower side of the substrate is connected to the cooling body directly, via a heat-conducting paste or via a metal layer.

16. The electronic power circuit of claim 1, constructed for use in a power converter or a switched mode power supply.

* * * * *